United States Patent [19]
Welch

[11] Patent Number: 5,731,712
[45] Date of Patent: Mar. 24, 1998

[54] PROGRAMMABLE GATE ARRAY FOR RELAY LADDER LOGIC

[76] Inventor: John T. Welch, 3210 Bancroft Rd., Akron, Ohio 44333

[21] Appl. No.: 555,731

[22] Filed: Nov. 9, 1995

[51] Int. Cl.⁶ ............................................. H03K 19/177
[52] U.S. Cl. .................................... 326/41; 326/39
[58] Field of Search .............................. 326/38, 39, 41

[56] References Cited

U.S. PATENT DOCUMENTS

| | | | |
|---|---|---|---|
| 3,473,160 | 10/1969 | Wahlstrom | 326/41 |
| 4,247,909 | 1/1981 | Bradley et al. | 364/147 |
| 4,441,161 | 4/1984 | Sasaki et al. | 395/375 |
| 5,058,052 | 10/1991 | Sexton et al. | 395/375 |
| 5,122,685 | 6/1992 | Chan et al. | 326/41 |
| 5,144,166 | 9/1992 | Camarota et al. | 326/44 |
| 5,187,393 | 2/1993 | El Gamel | 326/39 |
| 5,260,881 | 11/1993 | Agrawal et al. | 326/39 |
| 5,327,023 | 7/1994 | Kawana | 326/39 |
| 5,341,040 | 8/1994 | Garverick et al. | 326/44 |
| 5,369,314 | 11/1994 | Patel | 326/39 |
| 5,475,583 | 12/1995 | Bock et al. | 364/141 |

Primary Examiner—Edward P. Westin
Assistant Examiner—Benjamin D. Driscoll

[57] ABSTRACT

An architecture is provided for field programmable gate army (FPGA) devices which implement relay ladder logic in PLC systems. Once the device is programmed, the implemented logic is executed in rung parallel fashion at electronic speeds. A direct correspondence of these devices in detail to relay ladder logic assures that technology mapping software for the FPGA device will run sufficiently fast for use in PLC systems. A reversible device programming method is required, so that the device can be reprogrammed conveniently to different relay ladder models. The architecture scales to families of devices of differing sizes and resources. A basic relay ladder logic is implemented, which supports various relay ladder logic dialects.

8 Claims, 10 Drawing Sheets

| | ─ | ┬ | ├ | └ | ┴ | ┘ | │ | ┤ | ┼ | ┐ | ┌ |
|---|---|---|---|---|---|---|---|---|---|---|---|
| A | x | x | 0 | 0 | x | x | 0 | x | x | x | 0 |
| B | 0 | 0 | x | x | x | 0 | x | x | x | 0 | 0 |
| C | 0 | x | x | 0 | 0 | 0 | x | x | x | 0 | x |
| D | 0 | 0 | x | 0 | x | x | x | x | x | 0 | 0 |
| E | 0 | x | x | 0 | 0 | 0 | x | x | x | x | 0 |
| F | x | x | x | x | x | 0 | 0 | 0 | x | 0 | x | x - any nonzero selection

PROGRAMMABLE GATE ARRAY FOR RELAY LADDER LOGIC

FIELD OF THE INVENTION

This invention relates to field programmable gate array (FPGA) technology used in programmable logic controller (PLC) systems that support relay ladder logic.

DISCUSSION OF THE PRIOR ART

Relay ladder logic is a graphical programming language used extensively in programmable logic controller (PLC) systems. PLC systems make it possible for manufacturing plant designers without training in digital logic design to create and implement logical control models. Relay ladder logic emulates an electromechanical relay panel. It pictures combinational control logic on a PLC scan or clock cycle as a fluid or power flow from the leg rail of the ladder across rungs of the ladder toward the right rail. Relays controlled by logical variables are placed on ladder rungs to control the flow. The flow reaching the right rail determines the variables that are true on the next scan.

The computation of output values and state values over time, given input values, is known as solving the logic. I refer to solving in the process of controlling a plant as on-line solving, as opposed to simulated solving by the plant designer to observe the behavior of the logic model.

Relay ladder logic can be translated into Boolean logic for purposes of on-line solving. In Welch, "Translating unrestricted relay ladder logic into Boolean form", Computers in Industry, vol. 20, June 1992, pp. 45–61, I have shown the handling of all cases to require a complex algorithm. Translation also introduces difficulties in the designer's interpretation of logic errors, since patterns of values representing error conditions are no longer expressed as a ladder flow patterns. For these reasons, on-line solving based on the relay ladder model is preferred in PLC systems in which the control model is defined by relay ladder logic.

The amount of active control logic that can be solved by a PLC is limited by the speed at which a processor can execute ladder solving software. This limitation can preclude PLC use in time-critical applications and thereby increase development costs of these applications. It can also limit the amount of quality control and safety logic that can be included in the control model, thus effecting these issues in PLC systems.

Solving limitations have spawned a number of mechanisms in relay ladder languages aimed at reducing the amount of logic that is active at a particular time. A low level mechanism of this type is to selectively skip rungs in the solving process. Skipping is controlled by additional networks. A high level mechanism of this type is the use of sequential function chart logic to control which pages of ladder logic are active. Such mechanisms contribute nothing to the quality of the control model. They complicate the PLC relay logic language, making it less effective as a simple modeling language that requires a minimum of training. Such complications also increase the likelihood of modeling error.

Solving limitations have also encouraged a dangerous practice in PLC modeling known as sequential solving, in which variable changes determined by flow calculations are applied to contacts encountered subsequently in the same scan. The resulting behavior is relatively complex, being dependent on the order in which rungs are solved. The added complexity imposes costs of additional training and experience, and debugging time related to plant designers being unaware of consequences of this dependence. Synchronous solving, in which the results of one scan are applied to all contacts in the next scan, produces more predictable behavior. Synchronous logic models are fully capable of defining necessary controls. Improved on-line solving therefore permits the elimination of sequential solving from relay ladder programming.

The continuing popularity of relay ladder logic and the important role of the PLC industry adds to the economic and safety consequences of solving limitations and the value of the above practice improvements afforded by better solving methods.

A variety of means are provided in the prior art for improved on-line solving of relay ladder logic. A large number of specialized processors have been proposed, of which Pavicic et al in U.S. Pat. No. 4,215,399, issued Jul. 29, 1980, is a clear example. Data structures and solving algorithms have been devised for efficient ladder solving with conventional processors, as in Martin et al in U.S. Pat. No. 4,247,901, issued Jan. 27, 1981. Improvements have been found in the integration of Boolean logic solving and function block calculations, as in Struger et al in U.S. Pat. No. 4,302,820, issued Nov. 24, 1981. Even the activation and deactivation of relay ladder sections, characterized above as a necessary evil under the prior art, has seen patented improvements, such as U.S. Pat. No. 4,742,443 issued to Rohn et al on May 3, 1988.

None of the improvements just mentioned attempt to overcome the inherent disadvantage that a processor is required to sequentially traverse the currently active portion of the relay ladder model on every scan, one contact at a time. Compared to a method that removes the dependence of scan time on active model size, the above improvements in scan time are incremental, at best.

Another distinct disadvantage of specialized processors, and of specialized languages designed to generate efficient data structures for ladder solvers, is the further difficulties they bring to ladder programming. Such systems often require plant designers to use the instruction set of the processor, rather than ladder logic. Seldom is there any attempt to translate error conditions encountered on-line back into ladder flow presentations. These approaches therefore share many of the disadvantages of translating relay ladder logic to Boolean forms.

A distinctly different approach to relay ladder solving is to substitute digital logic circuits directly for ladder contacts and embedding ladder structure. Thus a corresponding hardware circuit is constructed for solving ladder rungs in parallel and with electronic speed. Prior to the development of field programmable devices, including field programmable gate arrays, practical substitution means did not exist. The present invention applies field programmable gate array technology to relay ladder control models as a practical means of substitution.

A field programmable gate array (FPGA) device in a PLC system will enable the most time critical portions of the control model to be executed in parallel fashion and at electronic speeds. The FPGA is an integrated circuit hardware device with a replicated pattern of circuits. These circuits can be connected and altered in function by applying a patient of programming bits to the device. Hardware circuits are thereby wired to implement a particular control model by programming the device. The application to PLC systems can be based on any convenient reversible programming technology that allows the wiring to be dismantled and reconstructed by software.

In current practice, field programmable gate arrays are designed to implement sets of Boolean functions. They are a flexible means of implementing digital designs quickly, for custom products or for prototypes. The FPGA device programming of Boolean functions is taught by Freeman in Pat. No. Reissue 34,363 reissued Aug. 31, 1993 and incorporated herein by reference. An alternative form of programmed Boolean logic circuit, along with a programmable routing mechanism we describe as a segmented channel, is taught by Kaplansky in Pat. No. Reissue 34,444 reissued Nov. 16, 1993, also incorporated herein by reference.

Given an FPGA device, a device program implementing a specific control model is constructed by technology mapping software. This software translates model descriptions consisting of sets of logical equations or other forms of logical function specifications, into bit patterns for programming the specific FPGA device. An overview is given by A. Sangiovanni-Vincentelli, et al; "Synthesis Methods for Field Programmable Gate Arrays", Proc. IEEE, July 1993, pp., 1057-1082.

Since relay ladder logic can be translated into Boolean functions, the solving of PLC logic models with existing FPGA devices is within the capability of the art. The disadvantages of translating relay ladder models to Boolean form have been described herein. An additional disadvantage is that software running times for translation of large models and for technology mapping will inhibit acceptance of FPGA devices in PLC systems. In digital design projects, long running times for technology mapping software are justified. In PLC development systems, fast technology mapping turnaround is more essential, because large models are frequently enhanced and fine tuned for performance.

A related art of relay ladder solving is taught in abandoned application Ser. No. 08/353,181 entitled "Relay Ladder Control System for Simulation and Monitoring" filed on Dec. 9, 1994, describing a method whereby a conventional processor can solve relay ladder logic in minimum time, without defining currently active portions of the logic. The dependence of scan time on active model size is eliminated by this method, by an algorithm I characterize by the term event chaining. Such a method does not obviate the need for FPGA mapped hardware solving in many applications. Rather, event chaining provides a practical way of handling large amounts of logic that is seldom or hopefully never effective, and therefore is not an efficient use of space on an FPGA device. A considerable amount of safety, recovery and quality control logic is of this type.

OBJECTS AND ADVANTAGES

My invention provides an architecture for field programmable gate array devices specific to the implementation of relay ladder logic models. The costs of technology mapping are substantially reduced, by providing a target FPGA architecture that conforms element by element to the relay ladder diagram. Such an architecture makes it unnecessary to translate relay ladder logic model into Boolean logic and then to map the Boolean model onto a device, as in current digital design practice. Technology mapping becomes a relatively simple process of allocating and placing ladder components on the device and defining connecting paths.

Accordingly, the objects and advantages of this invention are:

(a) to provide electronic and rung parallel solving of relay ladder logic in PLC systems, thus widening the control applications available to these systems;

(b) to encourage the full use of relay ladder logic for quality control and safety, without regard to solving delay in executing the model;

(c) to simplify relay ladder languages by permitting the elimination of model elements defining currently active portions of the control model;

(d) to make sequential solving unnecessary, and to encourage synchronously solved relay ladder models, thereby making ladder programming simpler and less prone to error;

(e) to simplify and thereby speed up technology mapping of relay ladder models to field programmable devices, enabling technology mapping software with running times acceptable in PLC systems;

(f) to provide for space efficient technology mapping through flexibility in relay ladder model implementation;

(g) to provide an architecture easily scaled to FPGA devices of different sizes and rung widths for varied PLC applications;

(h) to provide for FPGA solving of high use rungs to supplement event chaining software solving of low use rungs;

(i) to implement fully a basic relay ladder logic underlying existing language dialects.

The extent of these and other objects and advantages will become apparent from a consideration of the ensuing description and drawings.

SUMMARY

Figure 1:
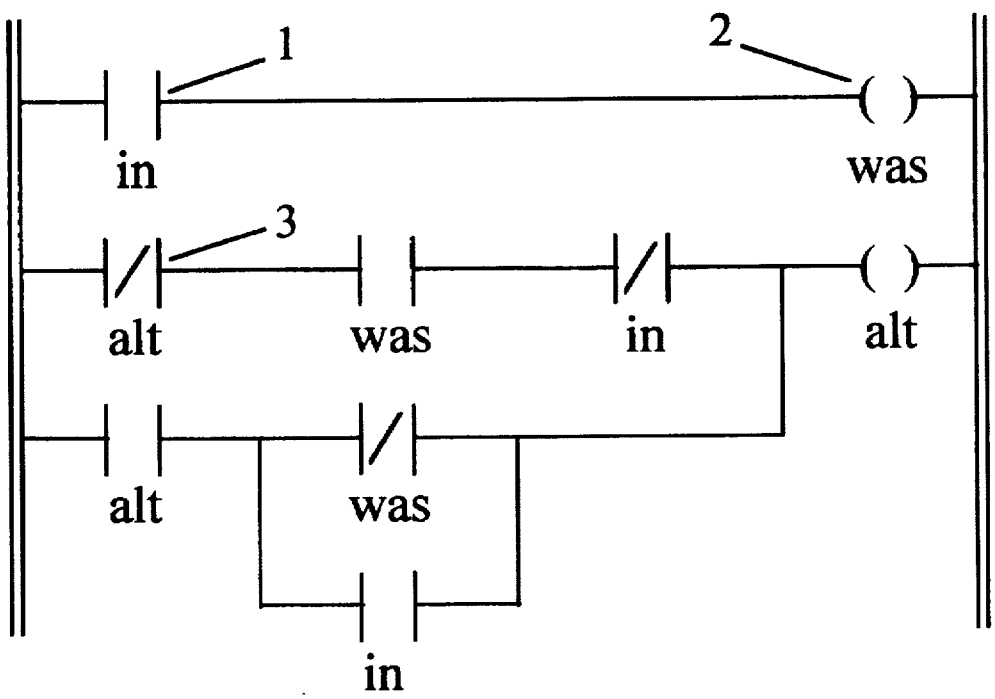
FIG. 1 shows a small relay ladder model illustrating ladder terminology and contact types.

The invention is an architecture for FPGA devices that implement relay ladder logic control models in PLC systems. A direct correspondence of these devices in detail to relay ladder logic assures that technology mapping of relay logic models will be practical in the application of a PLC system for industrial control. A reversible device programming method is required. The architecture scales to relay ladder models of all sizes. Families of devices can be defined for applications dissimilar in ladder width and length. The architecture supports basic relay ladder conventions and therefore can implement variations in relay ladder languages of existing PLC systems by minor variations in technology mapping procedures.

DETAILED DESCRIPTION OF THE INVENTION

A Basic Synchronous Relay Ladder Logic

Relay ladder logic is a widely used modeling language for combinational logic and embedded function block computations. Variations of relay ladder logic appear in PLC systems, but models expressed in any relay ladder logic dialect can be implemented by the basic relay ladder modeling language described in this section and implemented by my invention.

Relay ladder logic is a visual language. It depicts a set of Boolean functions as a ladder with rungs connected by vertical paths. A set of adjacent rungs connected by vertical paths is called a network. Rungs are populated at fixed intervals by contacts. The contacts act as relays, governing a fluid flow originating on every rung at the left rail of the ladder. The flow moves across the ladder toward the right rail. Closed contacts permit flow to pass and open contacts cut off the flow along the rung. Vertical paths allow flow to move vertically to neighboring rungs.

The open or closed state of a contact is determined by a control signal reflecting the current value of an associated logical variable. Contacts are of two types. A normally open contact is open if the controlling signal has a logical false value, and is closed if it has a logical true value. A normally closed contact is closed if the controlling signal has a logical false value, and is open if it is a logical true value. Control signals come from input terminals, or from storage elements called coils. Coils represent logical state and output variables.

A network implements a logical or Boolean function for a state or output variable. A network terminates on a coil placed at the right rail. Traditionally, there is one coil per network, and it is placed on the top rung of the network. if network flow on a scan reaches the coil, the value of the associated variable during the next scan, as applied to contacts or outputs, is a logical true. Otherwise, the next scan value is a logical false. The flows on all active networks are recomputed within the same scan, so the relay ladder acts as a synchronous machine.

Contacts in series along a rung between vertical paths implement the logical product, or AND, of the controlling variables. This is because flow crosses the rung only when all gates in the series are closed. A normally open contact thus represents the presence of the controlling variable in the product implemented by the series. A normally closed contact represents the presence of the logically complemented controlling variable in the product. The vertical paths implement the logical sum, or inclusive OR, of logical products. The logical sum is implemented where flow on separate rungs of the network merge. The flow continuing from such a point is cut off only if all of the merging flows are cut off. Thus the sum is false only if all component terms are false, which is a way to characterize the inclusive OR.

FIG. 1 shows a simple relay ladder model, consisting of two networks. The first network is a single rung with a normally open contact 1 controlled by the logical input variable in, and a coil 2 storing the state variable was. Synchronous machine behavior is well illustrated. The was signal reproduces the in signal, delayed by one scan. The second network of FIG. 1 computes the next scan value of alt. The contact 3 is an example of a normally closed contact. An equivalent logical equation for the second network is $$alt = \overline{alt}.was.\overline{in} + alt.(\overline{was} + in).$$

The ladder model of FIG. 1 exploits the synchronous operation of the solver to "divide" pulses of n. One alt pulse is produced for every pair of in pulses. The logical product was.$\overline{in}$ is true at a falling edge of in. The complement expression, the logical sum in parentheses, is false at this falling edge.

Figure 2:
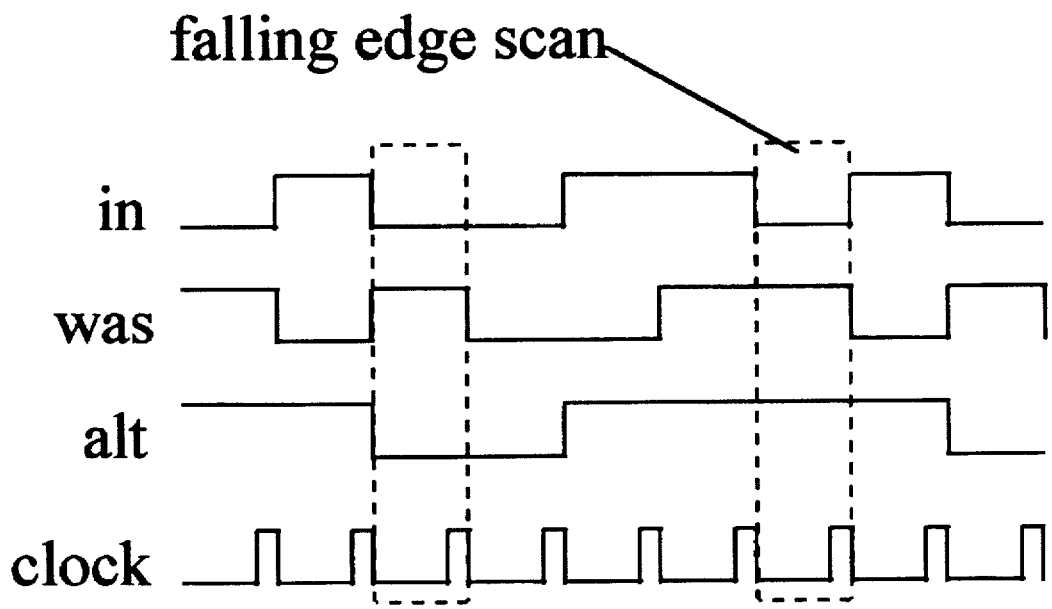
FIG. 2 shows model input/output waveforms illustrating synchronous behavior.

FIG. 2 presents clocked waveforms of sample input and output for the relay ladder logic of FIG. 1, showing its behavior as a synchronous machine. The low value of the clock signal marks the scan interval in which a new flow is computed. The high value marks the interval in which input and coil flow values are captured and transferred to memory output for the next scan interval. The falling edge scans are marked in the figure. The alt signal lags the in signal by a full scan.

Figure 3:
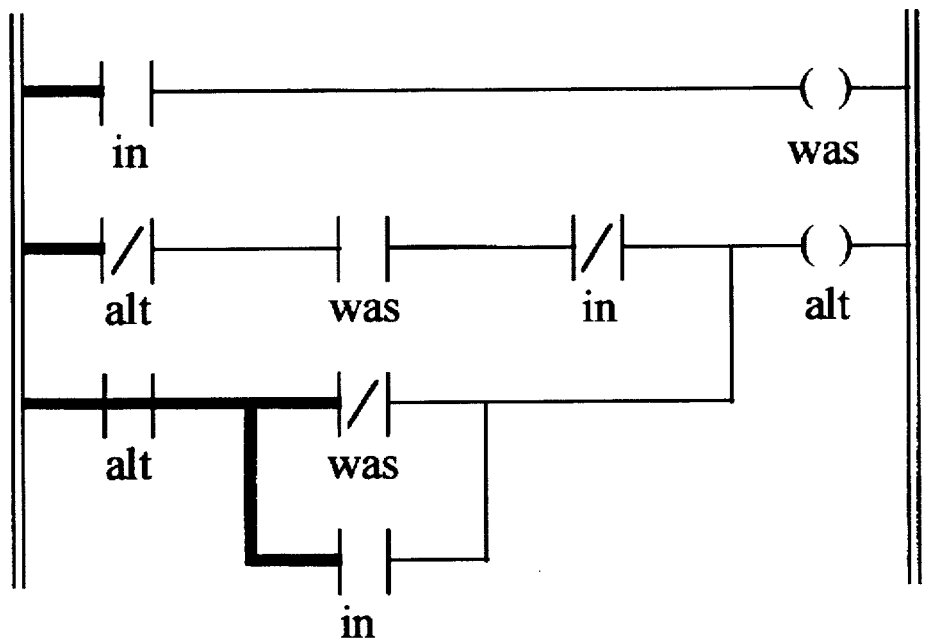
FIG. 3 shows a typical flow on the ladder model for one scan.

FIG. 3 depicts the flow on the ladder in a particular scan, in a manner which is typical in PLC development systems. Just prior to the scan shown, alt was true and so were in and was. As in goes false, the flow to the was coil is cut off. So is the flow along the bottom rung to the alt coil. On the next scan, was and alt will be false, keeping the flow from reaching the alt coil. On the next falling edge, a flow along the top rung will reach the alt coil, turning alt back on. The depiction of logic as a flow is easy to interpret and enables plant technicians to debug the logic with PLC simulations before installing it.

Figure 4:
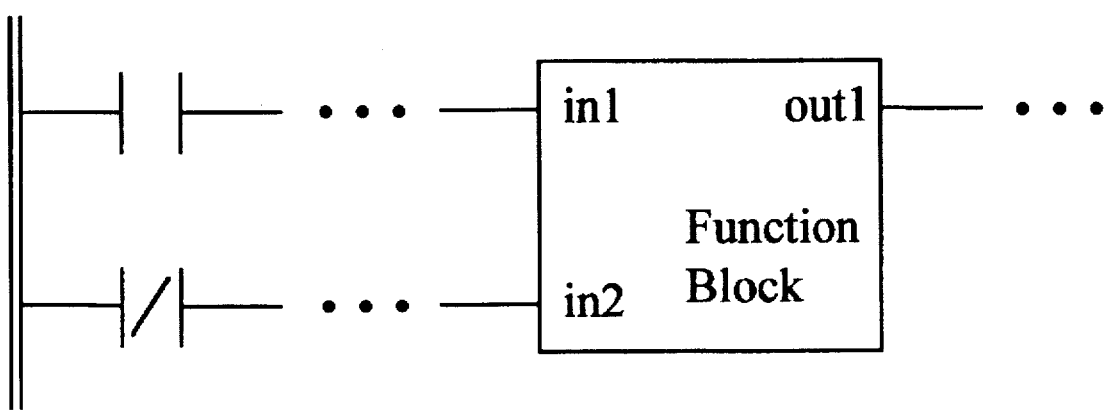
FIG. 4 shows a typical function block in relay ladder logic.

PLC relay ladder languages usually imbed rectangular function blocks within ladder logic structures, as shown in FIG. 4. Examples of such devices are counters, timers, sequencers and arithmetic operators. Ladder flow into the left side of the function blocks activate the embedded devices represented the blocks. Continuation rungs emerging from the coil side of the function blocks carry logical signals resulting from the action of such devices back into the ladder flow. The ensuing description will reveal how function blocks are accommodated in the FPGA architecture of my invention.

An FPGA Substitution Method for Relay Ladder Logic

My invention applies FPGA technology to provide a practical substitution method whereby an electronic circuit for the combinational logic of a relay ladder model is wired by device programming. A principle element of the invention is that a circuit on the FPGA device can be wired by the application of program bits to become the part needed by the model at that device location.

Figure 5:
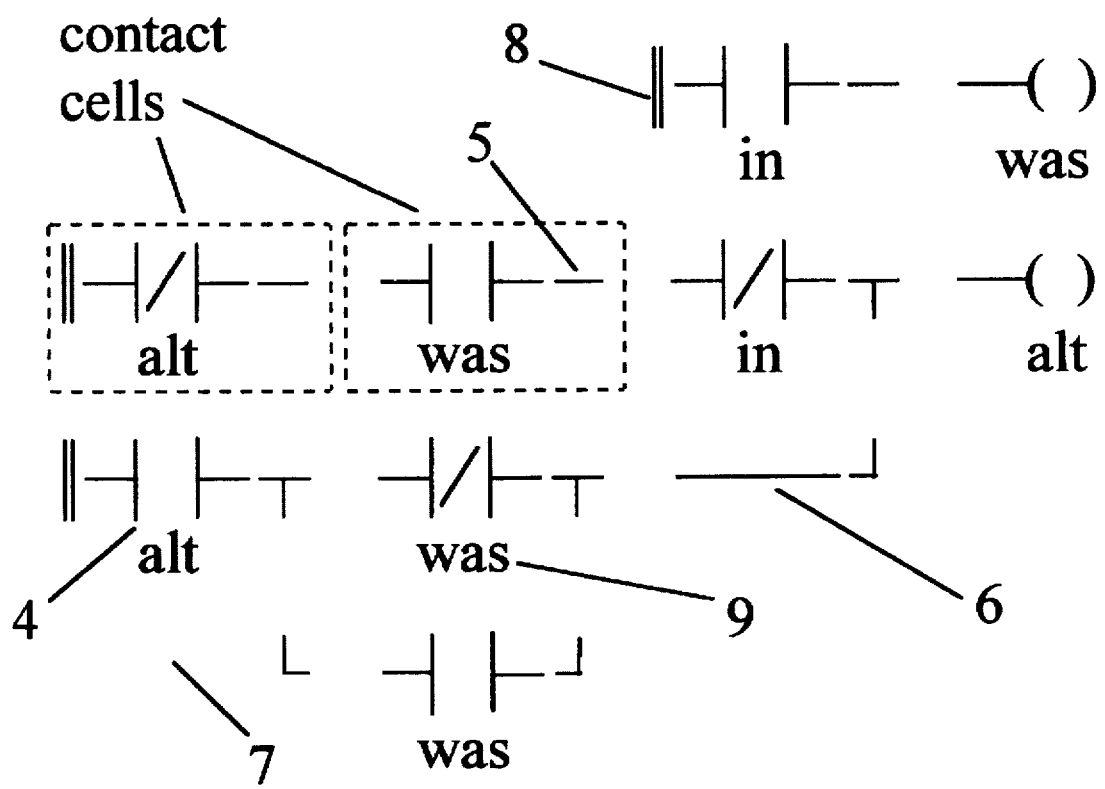
FIG. 5 shows the network of FIG. 1 as composed of contact and coil elements, separated by connectors.

FIG. 5 explodes the relay ladder model of FIG. 1 to show how ladder model parts are programmed into FPGA device circuits. The relay ladder model can be seen to be superimposed on an array of identical contact cells and a column of coil cells to the right of this array. Each contact cell specifies a contact 4 and a flow path connector 5. Coil cells consist of a memory element operated in a master/slave manner, sampling flow on one scan and presenting it as output on the next scan. A coil cell is provided for each row, allowing a new network to begin on any row. As illustrated by the cells of the example, the types of contact encountered are: the normally open contact, the normally closed contact, the connecting bar 6, and the "no contact" 7. The example illustrates many of the nine flow path connector types used in conventional relay logic diagrams. All of the connector types are listed later. The left rail is represented electronically on the FPGA as a component 8 of the contact cell. As the top row of the figure illustrates, this allows model ladder rungs to be shorter than the rows of the contact array. The association of a controlling signal with the contact, represented in the ladder diagram by a label 9 under the contact, is realized on the FPGA by device programmed wiring that brings a coil or input signal to the contact cell.

A Programmable Contact Block

Figure 6A:
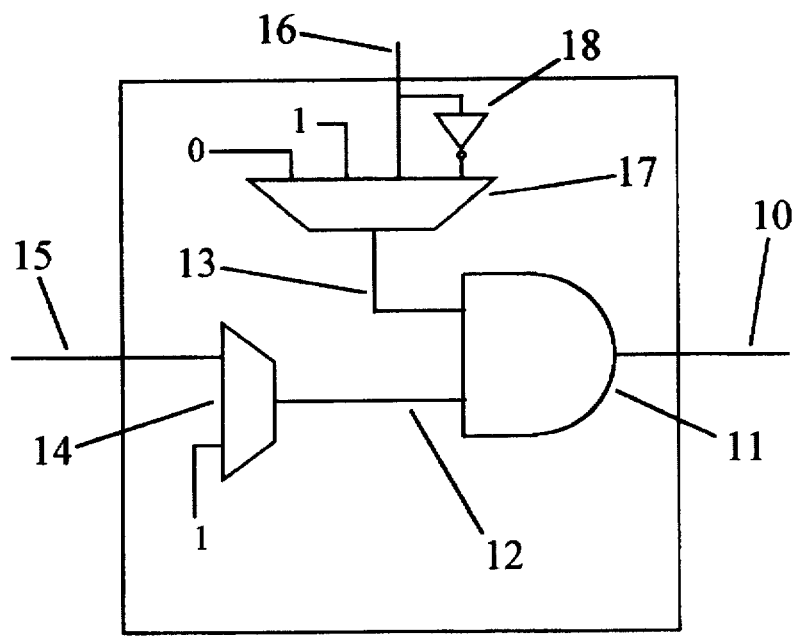
FIG. 6A is a gate level diagram of a programmable contact block embodiment.
Figure 6B:
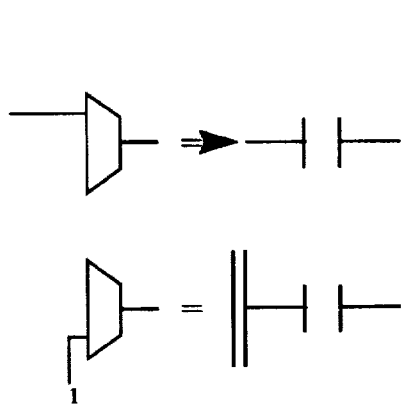
FIG. 6B shows the programming of rung flow into a contact.

Each contact cell contains a circuit that can be programmed to behave as a normally open contact or a normally closed contact, a connecting bar, or a "no contact". This circuit is a logic block in FPGA terminology, and is therefore referred to herein as a contact block. FIG. 6A shows an embodiment of the contact block in terms of conventional logic gates. The signal at a contact output flow terminal 10 is the output of an AND gate 11. This signal is the logical product of an input flow signal 12 and a relay control signal 13. The relay control signal represents the state of the relay, either closed (true) or open (false). The input flow signal represents the ladder flow entering the contact relay. A two input selector or multiplexer 14 is programmed by a single bit to determine whether the input flow signal will be the signal from the rung flow input terminal 15 or a constant logical true value (1). FIG. 6B summarizes the effect of the selector programming on the input flow signal. The logical true constant represents the contact as being at the left rail, where flow is assured.

The type of contact is determined by the manner in which an input or coil value affects the state of the relay. Referring again to FIG. 6A, the signal from the input or coil is present at a relay control terminal 16 of the contact block. The contact type is programmed by two bits specifying the relay control signal as the output of a four input selector 17. An inverter 18 provides the complement of the relay control signal to the selector.

Figure 6C:
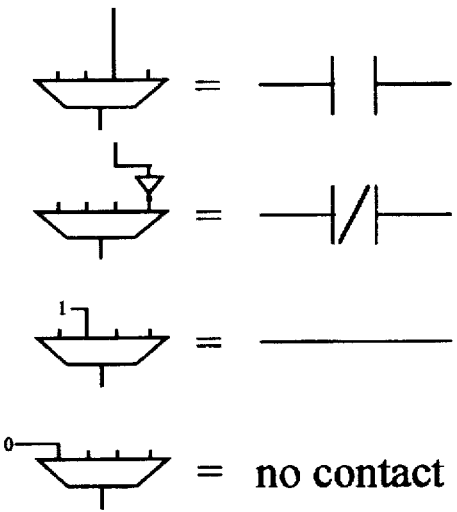
FIG. 6C shows the programming of the relay control signal to represent different types of contact.

FIG. 6C summarizes the contact types as determined by the programmed setting of the relay control selector 17. A normally open contact is implemented when the selector feeds the input or coil value directly to the AND gate. A normally closed contact is implemented when the value is inverted. Programed selection of the logical true constant (1) implements a permanently closed relay. Programmed selection of a logical false (0) value implements a permanently open relay to represent a cell with no contact element A Programmable Connector Switch As was demonstrated by FIG. 5, vertical paths between rungs can be defined by specifying a type of connector in each ladder array cell. On an FPGA device, connectors are implemented by programmed paths for logical signals representing the presence of flow. Relay logic modeling dictates that flow along rungs be confined to one direction, from the left rail towards the coil. Vertical flow up and down the ladder between rungs is bi-directional. Such signal flow is accomplished in my invention by connecting rung elements by a single wire, and connecting adjacent rows of the contact array with wire pairs, one wire for each direction of vertical flow. A circuit programmed to be a ladder connector is placed between the contact blocks described in the previous section. Since this circuit functions as a connector and operates as a switch according to FPGA terminology, it is called a connector switch in this description. On the FPGA device, a connector switch is permanently connected to corresponding connector switches in adjacent rungs by wire pairs representing vertical flow.

Figure 7:
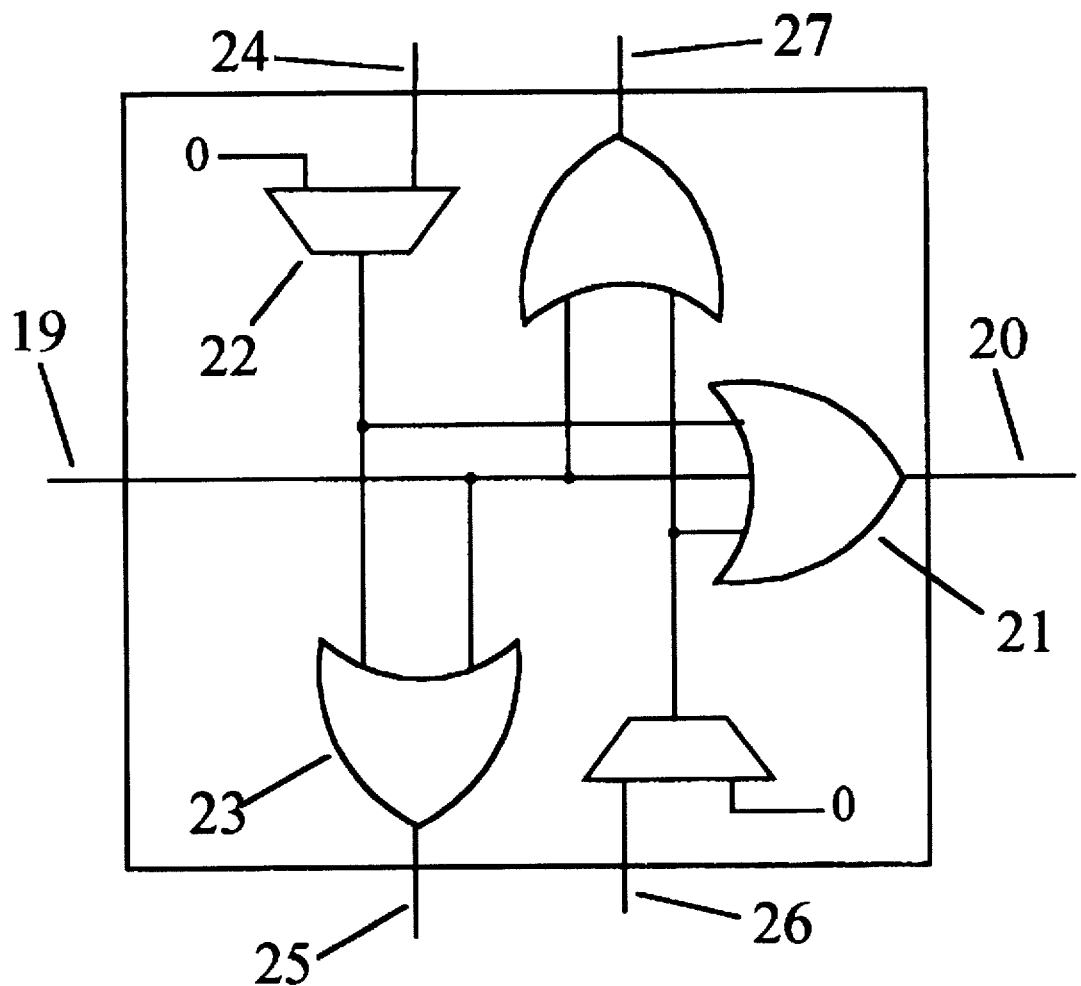
FIG. 7 is a gate level diagram of a programmable connector switch embodiment.

FIG. 7 shows a preferred embodiment of the connector switch, expressed in terms of standard logic gates. In this embodiment, the programming of connector type is accomplished with two programming bits, by taking advantage of the programming of contact type in adjacent contact blocks. A signal from a rail side contact block, arriving at the rung flow input terminal 19, is passed to a rung flow output terminal 20 through a three input OR gate 21. The OR gate merges vertical flow from both directions with flow along the rung. The rung flow input can be passed along to neighboring circuits without restriction because if such input is not allowed by the intended connector, the rail side contact it comes from will be programmed as "no contact" and the signal will be logically false. Similarly, if the intended connector type does not pass output flow along the rung, the coil side contact block receiving this output flow signal will be programmed as "no contact", and the output flow will be stopped at the AND gate of this contact block.

There are two vertical flow tracks through the connector switch of this embodiment. Continuing with FIG. 7, each track contains a two input selector 22 and a two input OR gate 23. The input selector of each track admits vertical flow from an adjacent connector switch, or replaces it with a logical false constant (0). The OR gate merges rung input flow with vertical flow in the track direction A downward flow track accepts flow at a downward flow input terminal 24 and presents downward flow at a downward flow output terminal 25. Similarly, an upward flow track accepts upward flow at an upward flow input terminal 26 and presents upward flow at an upward flow output terminal 27.

Figures 8A, 8B:
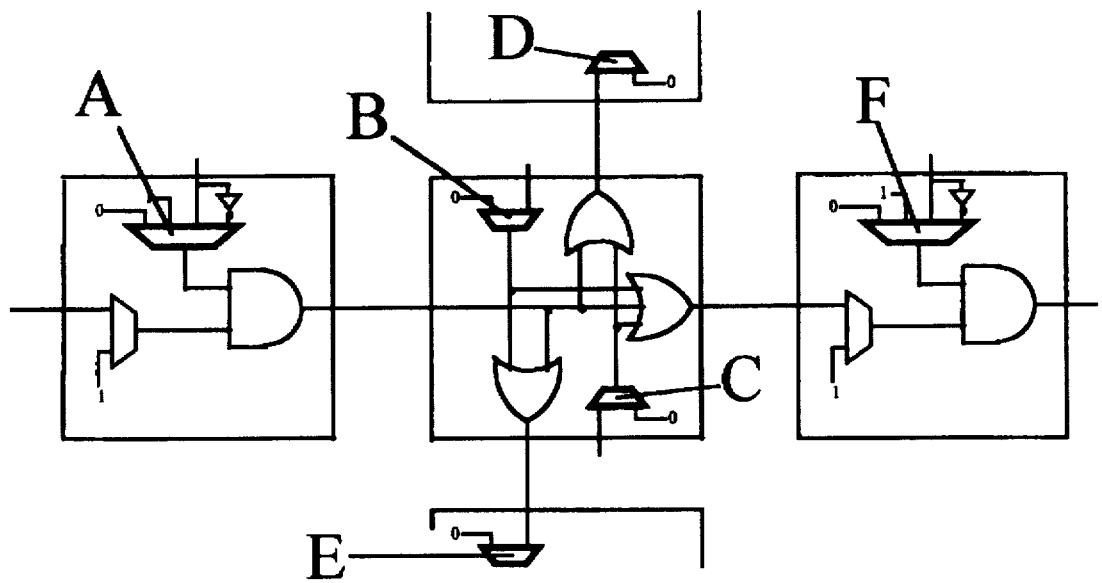
FIG. 8A shows the selectors in neighboring circuits that determine the connector implemented at a connector switch.
FIG. 8B is a chart of neighboring selector settings for implementing connectors.

The two selectors of this connector switch embodiment actually affect the connector types of neighboring connector switches. FIG. 8A shows a connector switch with its neighboring circuits. The neighboring programmable selectors are highlighted and labeled by capital letters. FIG. 8B is a corresponding chart demonstrating the device programming of the neighboring selectors to define the connector type of this connector switch. The symbol "0" in the chart denotes the programmed selection of a logical false constant and "x" in the chart represents the selection of any other selection. Every connector type is represented, but the last two connectors on the chart do not normally appear in conventional ladder diagrams. The exceptional case in which the connector switch is at the coil end of the contact array row is addressed later.

Logically equivalent alternative embodiments of the contact array cell of this invention can be expressed by using other types of standard gates, such as NAND gates and by the use of and by the use of switching networks.

Alternative embodiments can also be found by treating the left rail as a connector type, rather than as an alternative input within the contact block, and originating a logical true constant within the connector switch to implement that type. In such embodiments, the contact array cell can be viewed as a contact and a connector on its left rail side, and the coil cell can be viewed as having a connector. Such alternative embodiments offer no advantages over the preferred embodiment described.

The Rung Assembly

Referring again to FIG. 5, one row of the contact array and its associated memory cell implements one relay ladder rung and its coil. On the FPGA device of my invention, the corresponding circuitry will be called a rung assembly.

Figure 9:
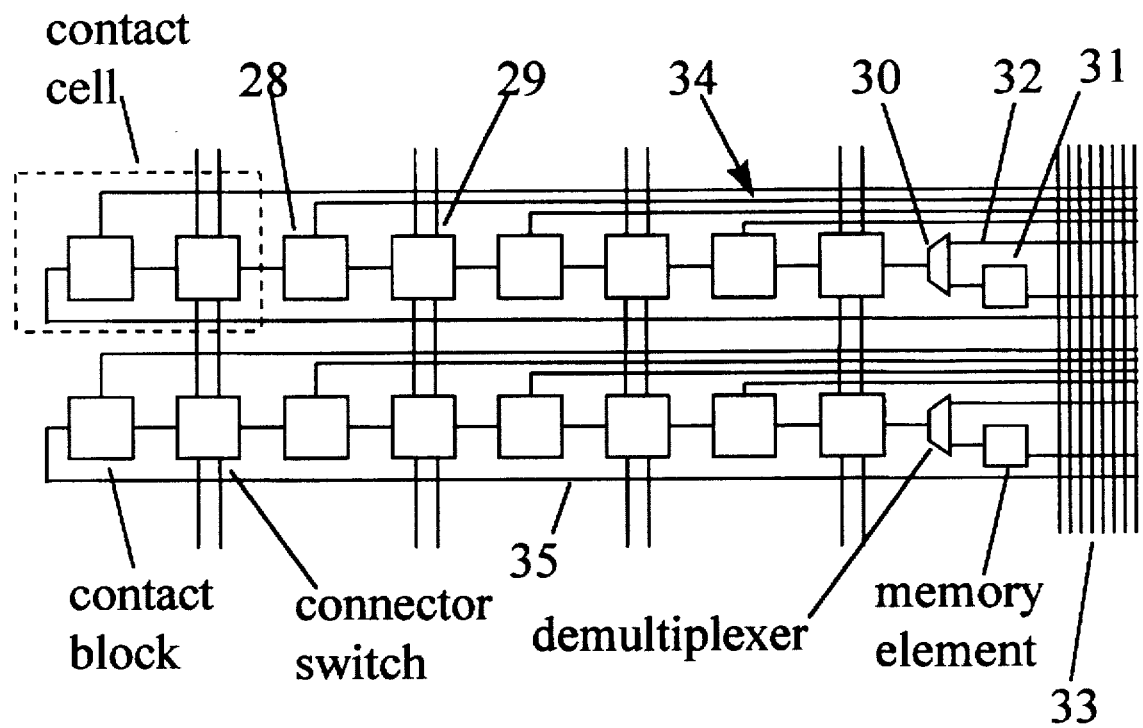
FIG. 9 shows two adjacent rung assemblies and the wire pair connections between them.

FIG. 9 shows two adjacent rung assemblies of a preferred embodiment, with wire pairs connecting their corresponding connector switches. A rung assembly contains a wired row of contact blocks 28 and connector switches 29. The connector switch at the coil end of the row feeds its rung output flow signal to a two output programmable demultiplexer 30. A device program bit routs this signal to a clocked memory element 31 representing a coil, or to a bypass wire 212. The memory element and the bypass wire are separately connected by device programming to wires of a segmented channel 33. The structure of a segmented channel is described later.

The segmented channel carries the bypass wire signal, or its delayed counterpart from the memory element to other rung assemblies and to output terminal pads. A coil is created by selecting the clocked memory element. On the next scan, the signal from the memory element is carrier by the segmented channel to output terminal pads, and to contacts associated with the coil. When routed to contacts, these signals become the relay control signals. Dedicated wires for relay control signals 34 are programmably connected across the segmented channel. These control signal wires also bring signals from input terminal pads, by means of the segmented channel. Clocked sample and hold, or latch, circuits for capturing input signals may be external to the FPGA device, or may be incorporated into it. Hereinafter the former case is assumed.

In relay logic modeling, logical products can be expressed having more factor variables than the number of contact cells in a row of the contact array. A modeling technique for doing this is to use one rung to compute a partial product, and to place a contact associated with the coil of this rung on another row containing additional factors of the product. This technique introduces a clocked scan delay into the implemented full product. The bypass wire 32 permits the length of a model rung to be extended beyond the number of contacts in a rung assembly, without introducing scan delay. The segmented channel routs the bypass wire signal from an extended rung directly to an extending rung assembly.

Embedded function blocks were mentioned earlier, with reference to FIG. 4. Returning to FIG. 9, another function of the memory bypass wire 32 is to rout a signal to the input terminal of a function block device by means of the segmented channel. The output signal(s) of the function block device can be delivered by the segmented channel to rung assemblies implementing continuation rungs on the coil side of the function block. When desired, a scan delay can be incorporated in the function block by using the flocked memory path to reach the function block device.

For the connector switch at the coil end of the contact row, the connector type programming demonstrated in FIG. 8A and FIG. 8B is altered slightly. There is no contact block selector F in this case. The false constant selection is implemented by leaving unconnected the segment crossing wires carrying rung output flow signal.

Figure 10:
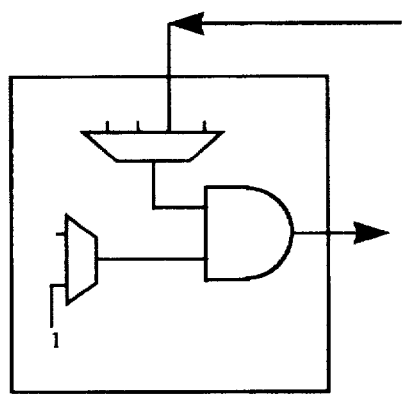
FIG. 10 shows how the relay control line may be used to extend a rung to a new rung assembly.

In both of the applications of the bypass wire mentioned above, the signal from the bypass wire can enter the extending rung as a control signal entering a "left rail" contact, as illustrated in FIG. 10. As the figure suggests, a partial product or function block output can be complemented at this paint, by routing through the inverter of the contact block embodiment. Returning to FIG. 9, an extension wire 35 is provided in the rung assembly, connecting across the segmented channel the input flow terminal of the first contact block on the left rail end of the row. The extension wire permits rungs to be extended and continued from function blocks without dedicating a contact block to the connection and thereby incurring the signal delay of its AND gate implementation.

Figure 11:
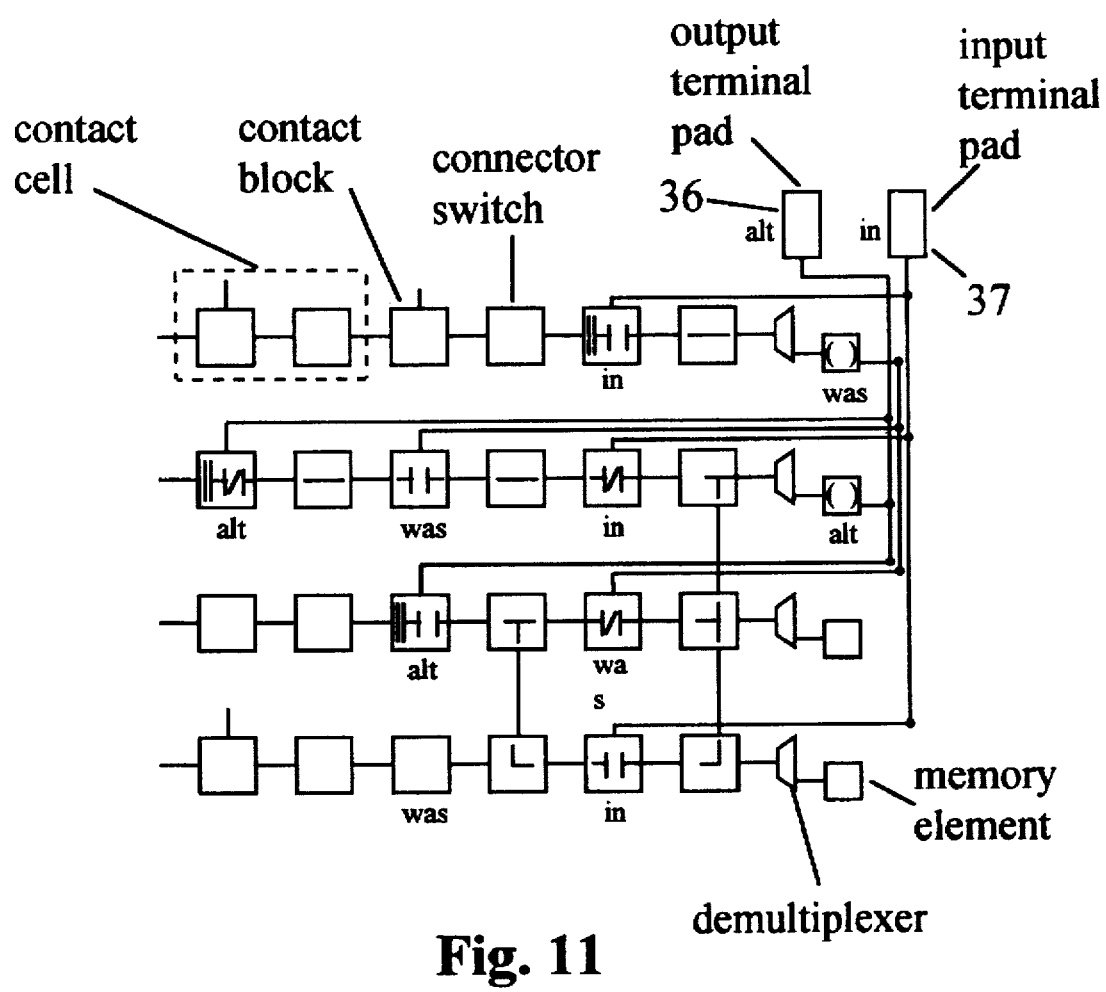
FIG. 11 shows a mapping of the model of FIG. 1 onto adjacent rung assemblies of four contact cells.

FIG. 11 shows a device program implementing the model of FIG. 1 on adjacent rung assemblies of the preferred embodiment just described. An output terminal pad 36 and an input terminal pad 37 are located at one end of the associated segmented channel. Three wire segments of the channel are locally assigned to the "divide by two" model by device programming. Device programmed connections on the segmented channel are denoted by blackened circles. FPGA elements that can be electrically connected or disconnected by device programmed connection circuits will hereinafter be said to be programmably connected.

Adjacent rung assemblies and their associated segmented channel are parts of a larger unit of my invention to be referred to herein as a network assembly. The operation of the network assembly depends upon features of its FPGA segmented channel which are described in the following section.

The FPGA Segmented Channel

The segmented channel is a characteristic feature of FPGA routing architecture. It is a set of parallel wire tracks, in which wire segments are laid end to end in a staggered fashion and are programmably connected to form longer segments. A fewer number of tracks contain longer segments uninterrupted by connection circuits. These tracks can deliver signals over greater distances without the signal delay created by connection circuits. In the segmented channel, the wire track becomes a resource allocated by device programming among signal pathways.

Figure 12:
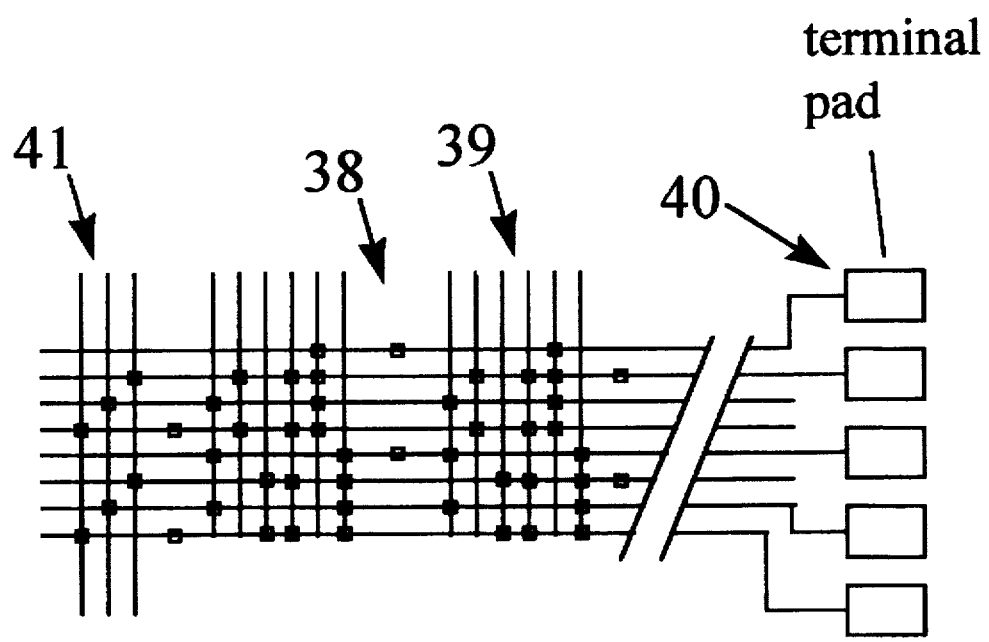
FIG. 12 illustrates the utilized features of FPGA segmented channels.

FIG. 12 illustrates the components of a segmented channel utilized in my invention. Programmable connection circuits are denoted in the figure by small squares. The end to end connections 38 confine the use of wire tracks to short segments for local signal paths. Logic block terminal wires 39 are extended across the channel tracks and provided with programmable connection circuits at selected crossing points. In my invention logic block terminal wires consist of the memory output and memory bypass wires, the relay control signal wires, and the extension wire. Terminal pads 40 are attached to selected wires, usually at one or both ends of the segmented channel. In some FPGA architectures, parallel segmented channels are programmably connected by means of wires or segmented channels 41 running perpendicular to them The numbers of programmable connections and their placement are designed for the FPGA device application. In the architecture of my invention, these parameters and others, such as numbers of contact blocks per rung assembly and numbers of wire tracks per segmented channel, are chosen for a specific device based on expected rung sizes and expected numbers of input, state and output variables in the targeted relay ladder applications of the device.

The Network Assembly

Figure 13:
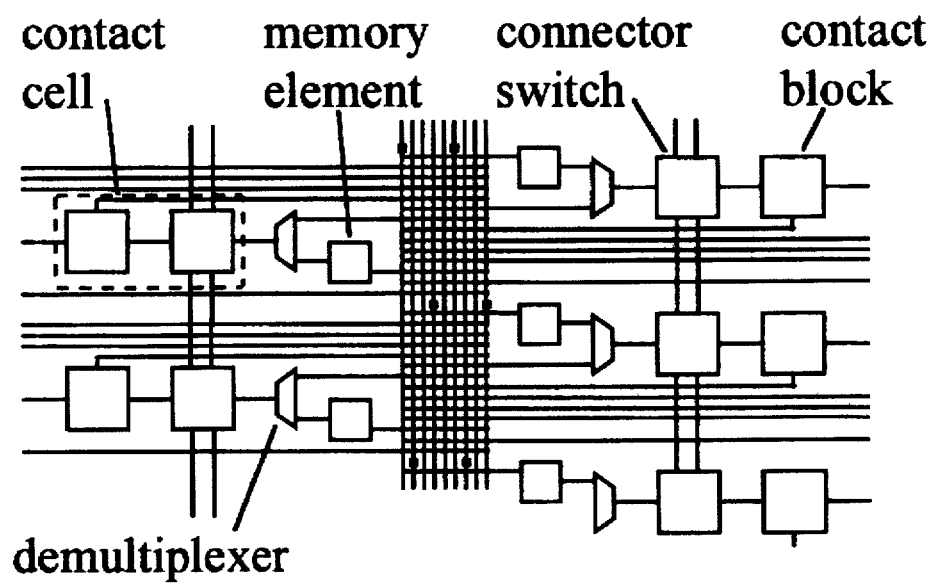
FIG. 13 shows details of a network assembly embodiment efficiently packing four contact cell rung assemblies along both sides of a segmented channel.

A segmented channel with terminal pads and rung assemblies attached as described herein will be called a network assembly, because it is capable of implementing a set of relay ladder logic networks. In a network assembly, rung assemblies are normally attached on both sides of the segmented channel. FIG. 13 shows an embodiment for rung assemblies of four contact cells each. An efficient packing of rung assemblies along the segmented channel is demonstrated in this embodiment. Rung assemblies on opposite sides are rotated by 180 degrees and their extension lines are displaced by one crossing position. The embodiment utilizes every crossing position along the segmented channel with the exception of one position between rung assemblies. This position is available for end to end channel wire connections (shown). The device design is continued by placing connection circuits on the remaining wire crossings. Additional end to end connection circuits can be placed at crossings not containing logic block connection circuits.

Figure 14:
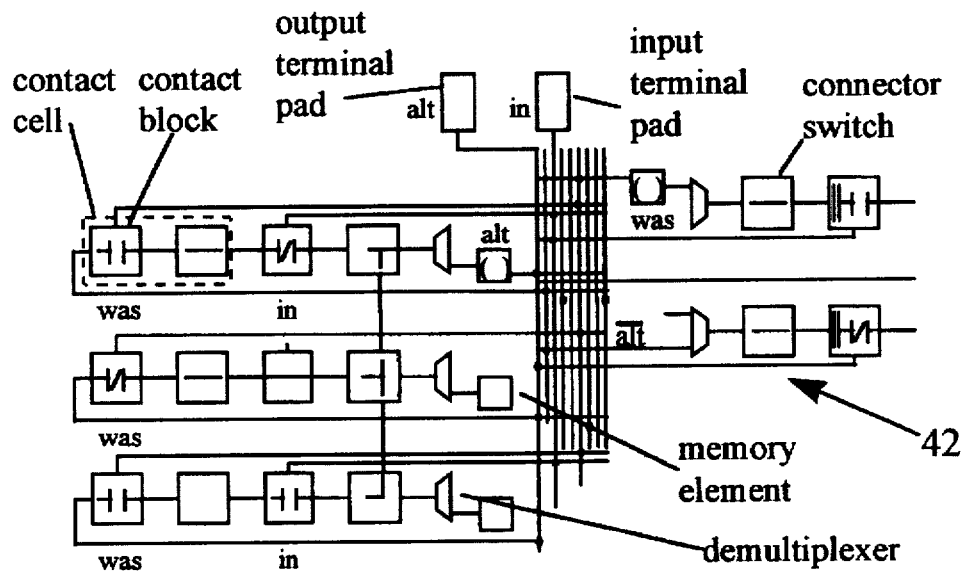
FIG. 14 shows a mapping of the model of FIG. 1 onto neighboring rung assemblies of two contact cells, illustrating the use of an extension line.

FIG. 14 shows a mapping of the model of FIG. 1 onto rung assemblies of two contact cells. This mapping illustrates the use of a rung assembly extension line. The extension line introduces the complement of alt into the top rung of the air network. The complement is generated in another rung assembly 42 by means of a normally closed contact.

Figure 15:
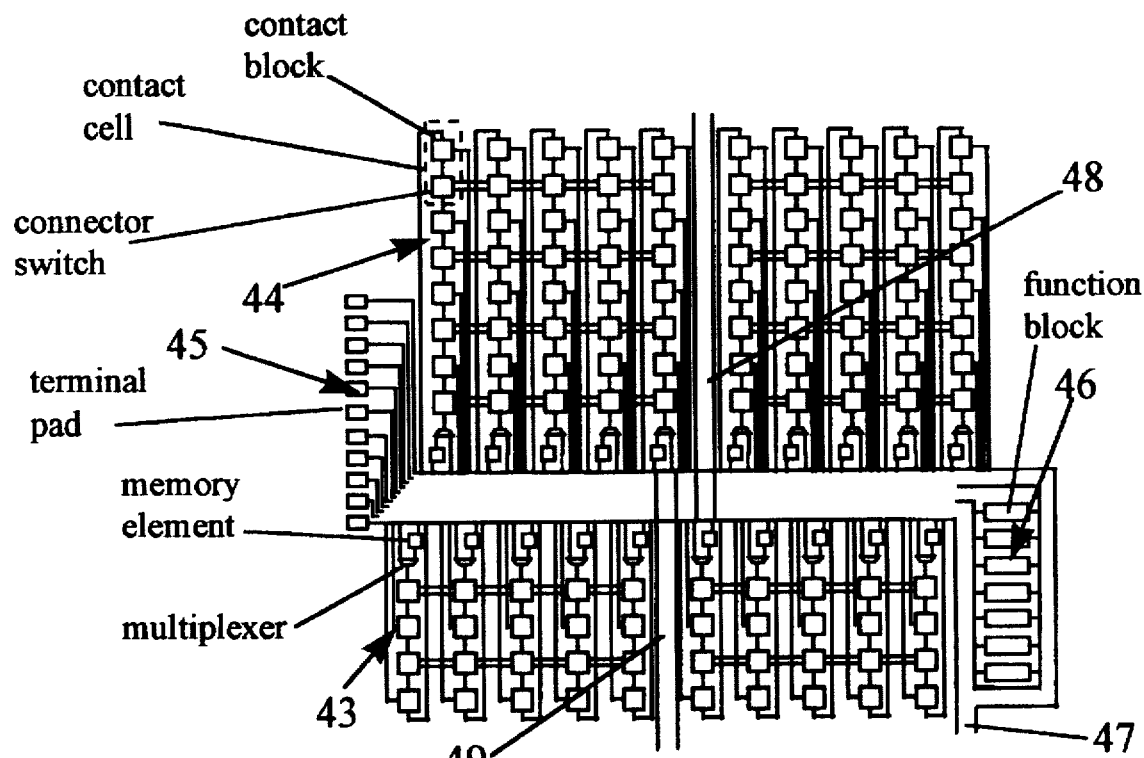
FIG. 15 shows the layout of a small network assembly.

FIG. 15 shows a typical layout of a small network assembly. Two cell rung assemblies 43 are placed on one side of the segmented channel, and four cell rung assemblies 44 on the other. Terminal pads for the network assembly 45 are attached to tracks at one end of the segmented channel. At the other end, a number of function block devices 46 are implemented on the FPGA device. The input/output terminals of there devices are programmably connected to tracks of the segmented channel, by extending track wires past the input and output terminals of the function block devices and providing logic block terminal connections to the extended channel wires.

A network assembly is normally positioned on the FPGA device with the terminal pads along an outer edge. The function block devices can be implemented in the center region of the device. A separate bus 47 provides access to the function block devices in order to set operational parameters such as timer intervals. In alternative embodiments function block devices can be implemented as external devices and terminal pads can be provided at both ends of a network assembly segmented channel.

Embodiments of my invention ordinarily provide programmable connections between network assemblies, so that a limited number of terminal pads, function block devices, and coil memory elements can be shared by networks implemented on different network assemblies. FIG. 12 illustrates in detail how network assembly channels are programmably connected by crossing wires and a pattern 41 of connection circuits. The connecting wire tracks are ordinarily segmented end to end as shown at 38. FIG. 15 shows where connecting channels 48 and 49 are placed between sets of rung assemblies.

Device Programming Technologies

The functions of device program bits in my invention have been described herein as selector and demultiplexer settings and as crossing point connection circuit settings. A variety of FPGA device programming technologies exist in practice. Any reversible technology can be used, in which the device can be conveniently and repeatedly programmed to implement different relay logic models. A RAM based programming technology, in which the device is reprogrammed by loading into a RAM the bit pattern generated by technology mapping software, is established in the art and is particularly well suited to the PLC application that is the object of the invention.

OPERATION OF THE INVENTION

My invention being an architectural basis for FPGA devices of specialized function, several stages of high level operation can be distinguished. First, statistical characteristics of a targeted class of relay ladder models are determined by a PLC vendor, and an FPGA product is defined by specifying a device layout. The layout provides appropriate placement of network assemblies, numbers of rung assemblies, cell widths of rung assemblies, track widths of segmented channels, attachments of terminal pads, and connection circuit patterns. Next, technology mapping software is generated. This so rare expresses the relay ladder model description written in the PLC vendor's relay ladder logic language in the basic relay ladder language detailed herein. It uses the basic model and given terminal pad assignments to realize the basic model as a device program, following the vendor's mapping policies to place model networks within device network assemblies and to allocate connecting channel track segments. The device program is then generated to specify contacts, connectors, and signal pathways.

Because the vendor relay ladder language and mapping policies remain constant over devices of different application, the generation of a specific technology mapping software will ordinarily be done automatically, once the language and policies are incorporated into code generation software. The creation of such software based on the architecture revealed herein is well known in the art.

The FPGA device, its technology mapping software, storage means for device programs, and a download program is provided to plant designer customers as standard parts or options of a PLC system. The designers select portions of a relay ladder model to be implemented on the FPGA device, and specify external input/output terminal pad assignments for the device. They run the technology mapping software to create a device program. The download program is run to program the FPGA and put it into operation. The FPGA then functions as a hardwired synchronous machine, implementing its assigned portion of the relay ladder model.

In a PLC system realizing fully the objects of my invention, an event chaining software solver is utilized to implement the ladder logic not selected for FPGA implementation.

The detailed operation of the FPGA realization of a basic relay ladder logic model is fully specified in the detailed parts description given herein.

I claim:

1. A programmable gate array directly implementing relay ladder logic, comprising:

a plurality of programmable network assemblies, each said programmable network assembly implementing a plurality of relay ladder networks, and each said programmable network assembly comprising:

(a) a plurality of programmable rung assemblies implementing relay ladder rungs, (b) a plurality of terminal pads for logical input and output signals, (c) a segmented channel means of programming logical signal paths between said terminal pads and said programmable rung assemblies, and (d) a plurality of vertical flow wires connecting said programmable rung assemblies, each said programmable rung assembly comprising:

(a) a plurality of identical programmable contact cells, each said programmable contact cell including a rung flow input terminal and a rung flow output terminal, with said rung flow output terminal generally connected to said rung flow input terminal of one other contact cell with the exception of one contact cell nearest the said segmented channel means, each said programmable contact cell further comprising a relay control terminal, an upward flow input terminal, an upward flow output terminal, a downward flow input terminal and a downward flow output terminal, said upward flow input terminal being generally connected to said upward flow output terminal of a correspondingly positioned contact cell in a first adjacent said programmable rung assembly by one of said vertical flow wires of said programmable network assembly, the said downward flow input terminal being generally connected to said downward flow output terminal of a correspondingly positioned contact cell in a second adjacent programmable rung assembly by one of said vertical flow wires of said programmable network assembly, and said upward flow output terminals being generally connected to said upward flow input terminal of a correspondingly positioned contact cell in said first adjacent programmable rung assembly by means of one of said vertical flow wires of said programmable network assembly, and said downward flow output terminal being generally connected to said downward flow input terminal of a correspondingly positioned contact cell in said second adjacent programmable rung assembly by means of one of said vertical flow wires of said programmable network assembly, said programmable contact cells further comprising a programmable logic means of selecting a rung flow signal from a group consisting of the signal at the said rung flow input terminal, or a constant logical signal representing assured rung flow of the relay ladder left rail, a logical inverter means for generating the logical complement of the signal at said relay control terminal, a programmable logic means of selecting a contact control signal from a group consisting of the signal at said relay control terminal, the said logical complement of the signal at said relay control terminal, a constant true logical signal, and a constant false logical signal, a logical gate means of providing the logical product of said rung flow signal and said contact control signal as a contact output signal, a programmable logic means for selecting an upward flow signal from a group consisting of the signal at said upward flow input terminal and a constant false logical signal representing the absence of upward flow, a programmable logic means for selecting a downward flow signal from a group consisting of the signal at said downward flow input terminal and a constant false logical signal representing the absence of downward flow, a logical gate means for providing at the said upward flow output terminal the logical sum of said upward flow signal and said contact output signal, a logical gate means for providing at the said downward flow output terminal the logical sum of said downward flow signal and said contact output signal, a logical gate means of providing at said rung output flow terminal the logical sum of said contact output signal, said upward flow signal and said downward flow signal, (b) a plurality of relay control signal lines programmably connecting said segmented channel means of said programmable network assembly to each of said relay control terminals of said programmable contact cells, (c) a clocked single bit memory element means for storing a logical signal, with the input terminal of the memory element connected to the rung flow output terminal of said programmable contact cell which is not connected to the rung flow input terminal of another contact cell, the output terminal of said memory element being connected to said segmented channel means.

2. The programmable gate array of claim 1, wherein:
said rung output flow terminal of the contact cell not connected to another contact cell is connected instead to the input terminal of a programmable two output demultiplexer means for selecting a flow output destination from the group consisting of the input terminal of said memory element and a bypass wire connected directly to said segmented channel means, whereby rung output signals not subject to scan delay are made available.

3. The programmable gate array of claim 1, wherein:
said rung flow input terminal of said programmable contact cell which is not connected with said rung flow output terminal of another contact cell, is connected to said segmented channel means.

4. The programmable gate array of claim 1, wherein:
timers and counters are implemented on the gate array device, and provided with programmable access to a data bus for loading of data parameters, the logical inputs of said timers and counters being programmably connected to said segmented channel means, and the logical outputs of said timers and counters being programmably connected to said segmented channel means.

5. The programmable gate array of claim 1, wherein:
said segmented channel means of said programmable network assemblies are programmably connected to segmented channel means of other programmable network assemblies.

6. The programmable gate array of claim 1, wherein said programmable contact cell comprises:
a contact block providing said rung flow input terminal, said relay control terminal, and said contact output terminal, and
a connector switch providing a contact input terminal wired to said contact output flow terminal of said contact block,
said connector switch further providing said upward flow input terminal, said upward flow output terminal, said downward flow input terminal, said downward flow output terminal, and said rung output flow terminal of said programmable contact cell;
said contact block being programmable to provide at said contact output terminal a signal from the group consisting of
(a) a false logical value, whereby a ladder cell without a contact is emulated,
(b) the signal at said rung flow input terminal, whereby a connecting wire is emulated,
(c) the signal at said relay control terminal, whereby a rung continuation is emulated, (d) the logical complement of the signal at said relay control terminal, whereby a complemented rung continuation is emulated, (e) the logical product of the signal at said rung flow input terminal and the signal at said relay control terminal, whereby a normally open contact is emulated, and (f) the logical product of the signal at said rung flow input terminal and the logical complement of the signal at said relay control terminal, whereby a normally closed contact is emulated, and said programmable connector switch being programmable to provide at said upward flow output terminal the logical sum of the signal at said contact input terminal and a signal selected from the group consisting of a logical false value and the signal at said upward flow input terminal, said programmable connector switch being programmable further to provide at said downward flow output terminal the logical sum of the signal at said contact input terminal and a signal selected from the group consisting of a logical false value and the signal at said downward flow input terminal, said programmable connector switch being programmable further to provide at said rung flow output terminal the logical sum of signals provided at said upward flow output terminal and said downward flow output terminal.

7. The programmable gate array of claim 1, wherein said programmable contact cell comprises:

a contact block providing said rung flow input terminal, said relay control terminal, and said contact output terminal, and a connector switch providing a contact input terminal wired to said contact output flow terminal of said contact block, said connector switch providing further said upward flow input terminal, said upward flow output terminal, said downward flow input terminal, said downward flow output terminal, and said rung output flow terminal of said programmable contact cell;

said contact block comprising means for providing:
(a) an inverter gate with input connected to said relay control terminal,
(b) a programmable four input selector with input terminals connected to:
a constant logical false signal,
a constant logical true signal,
said relay control terminal, and
said inverter gate output, respectively,
(c) a programmable two input rung flow selector with input terminals connected to:
a constant logical true signal, and
said rung flow input terminal;
(d) a two input AND gate with input terminals connected to:
the output terminal of said four input selector and
the output terminal of said programmable two input rung flow selector; respectively, said two input AND gate providing the signal at said contact output terminal; and said connector switch comprising means for providing:
(a) a programmable two input upward flow selector with inputs connected to a constant logical false signal and said upward flow input terminal, respectively,
(b) an upward flow OR gate with input terminals connected to the output terminal of said programmable two input upward flow selector and said rung flow input terminal; respectively, (c) a programmable two input downward flow selector with input terminals connected to a constant logical false signal and said downward flow input terminal, respectively,
(d) a downward flow OR gate with input terminals connected to the output terminal of said programmable two input downward flow selector and said rung flow input terminal; respectively,
(e) an output OR gate providing the logical signal at said rung flow output terminal, the input terminals of said output OR gate being connected to each member, respectively, of the group consisting of said contact output terminal and the output terminals of said programmable two input upward selector and said programmable downward flow selector.

8. The programmable gate array of claim 1, wherein said programmable contact cell comprises:

a contact block providing said rung flow input terminal, said relay control terminal, and said contact output terminal, and a connector switch providing a contact input terminal wired to said contact output flow terminal of said contact block, said connector switch providing further said upward flow input terminal, said upward flow output terminal, said downward flow input terminal, said downward flow output terminal, and said rung output flow terminal of said programmable contact cell;

said contact block comprising means for providing:
(a) an inverter gate with input connected to said relay control terminal,
(b) a programmable four input selector with input terminals connected to:
a constant logical false signal,
a constant logical true signal,
said relay control terminal, and
said inverter gate output, respectively,
(c) a programmable two input rung flow selector with input terminals connected to:
a constant logical true signal, and
said rung flow input terminal;
(d) a two input AND gate with input terminals connected to:
the output terminal of said four input selector and
the output terminal of said programmable two input rung flow selector; respectively, said two input AND gate providing the signal at said contact output terminal; and said connector switch comprising means for providing:
(a) a programmable two input upward flow selector with inputs connected to a constant logical false signal and said upward flow input terminal, respectively,
(b) an upward flow OR gate with input terminals connected to the output terminal of said programmable two input upward flow selector and said rung flow input terminal; respectively,
(c) a programmable two input downward flow selector with input terminals connected to a constant logical false signal and said downward flow input terminal, respectively,
(d) a downward flow OR gate with input terminals connected to the output terminal of said programmable two input downward flow selector and said rung flow input terminal; respectively,
(e) input terminals of an output OR gate being connected to the outputs of the programmable two input upward flow selector and the programmable two input downward flow selector.

* * * * *